United States Patent [19]
Masaki et al.

[11] Patent Number: 5,610,535
[45] Date of Patent: Mar. 11, 1997

[54] PROGRAMMABLE TWO-LINE, TWO-PHASE LOGIC ARRAY

[75] Inventors: Akira Masaki, Musashino; Makoto Kuwata, Hamura; Ryuichi Satomura; Nobuo Tamba, both of Ohme, all of Japan

[73] Assignee: Hitachi, Ltd., Tokyo, Japan

[21] Appl. No.: 533,990

[22] Filed: Sep. 27, 1995

[30] Foreign Application Priority Data

Sep. 28, 1994 [JP] Japan .................................. 6-258809

[51] Int. Cl.$^6$ ............................. H03K 19/94; H03K 7/38
[52] U.S. Cl. ................................................. 326/39; 326/45
[58] Field of Search ................................ 326/39, 44, 45

[56] References Cited

U.S. PATENT DOCUMENTS 3,618,050  11/1971  Heeren et al. ........................... 326/106
3,987,286  10/1976  Muehldorf ................................. 326/39
5,221,867   6/1993  Mitra et al. ............................... 326/39

OTHER PUBLICATIONS

Information Processing, vol. 34, No. 1, Jan. 1993, pp. 72–80. "Asynchronous Processors Toward Ultra–Speed VLSI Systems" and English translation.

IEEE Design & Test of Computers, Summer 1994, "TITAC: Design of a Quasi–Delay–Insensitive Microprocessor", T. Nanya et al, pp. 50–63.

VLSI Handbook, Academic Press, Inc., 1985, Chapter 2, Mohsen et al, pp. 14–35.

Primary Examiner—David R. Hudspeth
Assistant Examiner—Richard Roseen
Attorney, Agent, or Firm—Fay, Sharpe, Beall, Fagan, Minnich & McKee

[57] ABSTRACT

A programmable two-line, two-phase logic array has a plurality of inputs, each having two input signals operating in two phases and memory cells provided at an intersection of the input signal lines and output lines corresponding to at least one function that cross the input lines. The memory cells are capable of being written in the fabrication process or by a field programming process that addresses the contact points at which the input and output lines cross. The two-line, two-phase logic circuit can be attained by the same technique as that used for attaining a conventional PLA without designing circuitry based on a conventional synchronous logic beforehand followed by replacing it with a two-line, two-phase circuit.

20 Claims, 12 Drawing Sheets

FIG. 2

| I1+ | I1- | I2+ | I2- | In+ | In- | O1+ | O1- | O2+ | O2- | Om+ | Om- |
|---|---|---|---|---|---|---|---|---|---|---|---|
| 0 | 0 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 |
| 0 | 0 | 0 | 0 | 1 | 0 | 0 | 0 | 0 | 0 | 0 | 0 |
| 0 | 0 | 0 | 1 | 0 | 0 | 0 | 0 | 0 | 0 | 0 | 0 |
| 0 | 0 | 0 | 1 | 0 | 1 | 0 | 0 | 1 | 0 | 0 | 0 |
| 0 | 0 | 0 | 1 | 1 | 0 | 0 | 0 | 0 | 1 | 0 | 0 |
| 0 | 0 | 1 | 0 | 0 | 0 | 0 | 0 | 0 | 0 | 0 | 0 |
| 0 | 0 | 1 | 0 | 0 | 1 | 0 | 0 | 0 | 1 | 0 | 0 |
| 0 | 0 | 1 | 0 | 1 | 0 | 0 | 0 | 0 | 1 | 0 | 0 |
| 0 | 1 | 0 | 0 | 0 | 0 | 0 | 0 | 0 | 0 | 0 | 0 |
| 0 | 1 | 0 | 0 | 0 | 1 | 0 | 0 | 0 | 0 | 0 | 0 |
| 0 | 1 | 0 | 0 | 1 | 0 | 0 | 0 | 0 | 0 | 0 | 0 |
| 0 | 1 | 0 | 1 | 0 | 0 | 0 | 0 | 0 | 0 | 0 | 0 |
| 0 | 1 | 0 | 1 | 0 | 1 | 0 | 1 | 1 | 0 | 0 | 1 |
| 0 | 1 | 0 | 1 | 1 | 0 | 0 | 1 | 0 | 1 | 0 | 1 |
| 0 | 1 | 1 | 0 | 0 | 0 | 0 | 0 | 0 | 0 | 0 | 0 |
| 0 | 1 | 1 | 0 | 0 | 1 | 0 | 1 | 0 | 1 | 0 | 1 |
| 0 | 1 | 1 | 0 | 1 | 0 | 0 | 1 | 0 | 1 | 1 | 0 |
| 1 | 0 | 0 | 0 | 0 | 0 | 0 | 0 | 0 | 0 | 0 | 0 |
| 1 | 0 | 0 | 0 | 0 | 1 | 0 | 0 | 0 | 0 | 0 | 0 |
| 1 | 0 | 0 | 0 | 1 | 0 | 0 | 0 | 0 | 0 | 0 | 0 |
| 1 | 0 | 0 | 1 | 0 | 0 | 0 | 0 | 0 | 0 | 0 | 0 |
| 1 | 0 | 0 | 1 | 0 | 1 | 0 | 1 | 1 | 0 | 0 | 1 |
| 1 | 0 | 0 | 1 | 1 | 0 | 0 | 1 | 0 | 1 | 0 | 1 |
| 1 | 0 | 1 | 0 | 0 | 0 | 0 | 0 | 0 | 0 | 0 | 0 |
| 1 | 0 | 1 | 0 | 0 | 1 | 1 | 0 | 0 | 1 | 0 | 1 |
| 1 | 0 | 1 | 0 | 1 | 0 | 0 | 1 | 0 | 1 | 0 | 1 |

PROGRAMMABLE TWO-LINE, TWO-PHASE LOGIC ARRAY

FIELD OF THE INVENTION

The present invention relates to a programmable two-line, two-phase logic array.

BACKGROUND OF THE INVENTION

Synchronous logic circuits are widely known and used in computer systems. Notwithstanding, the limitations of such synchronous logic circuits are increasingly recognized as the operating speed of devices is stepped up and as there develops a demand for further improvement in performance so as to implement a plan for developing high-speed systems. One of the problems is that it becomes difficult to decrease the ratio of the clock skew to the clock cycle time below a certain level as the clock frequency increases so it is difficult to improve the performance of computer systems implementing such circuits. Also, in order to decrease the power consumption of the system, CMOS (Complementary MOS) has widely been employed because the power is consumed only when the circuit is switched. The greatest benefit of using a CMOS circuit will not be realized, however, since the signal transition frequency increases in the circuit of the system as the clock frequency increases.

Consequently, expectations have been focused on designing an asynchronous logic circuit that is switched when required logically without the need for a clock signal. Although there are various designs of asynchronous logic circuits, a two-line, two-phase system has been considered relatively easy to design. The two-line, two-phase system is designed such that one-bit data D is expressed by the two-line signals (d+, d−), wherein the invalid state (no valid data present) is expressed when (d+, d−) is (0, 0); "0" is produced by the transition from (0, 0) to (0, 1); and "1" is produced by the transition from (0, 0) to (1, 0). The state (1, 1) is not employed in this case. As an example, a two-line, two-phase asynchronous processor is disclosed in "Information Processing, vol. 34, No. 1, pp. 72–80, issued in January, 1993."

FIG. 12(a) shows an ordinary logic circuit, whereas FIG. 12(b) shows a logic circuit in which a two-line, two-phase system is employed as a substitute. The replacement of the logic circuit shown in FIG. 12(a) with the one shown in FIG. 12(b) requires comparing and contrasting an ordinary unit gate circuit with a corresponding two-line, two-phase unit gate circuit one by one before replacing the logic gate circuit on a unit basis. Ordinary, conventional unit gate circuits and the corresponding two-line, two-phase unit gate circuits that are substituted therefor are shown in FIG. 13. In the case of a relatively simple logic circuit such as that shown in FIG. 12(a), it is not so much trouble to replace the logic circuit. However, a complicated logical combination is normally required in practical circuit-designing. Consequently, ordinary synchronous logic is often used to design a circuit and then two-line, two-phase logic based on the aforementioned asynchronous logic substitutions is used as a substitute. Thus, it takes twice the time to design circuits because of the increased number of steps taken to make the substitutions. This constitutes a disadvantage to implementing asynchronous logic such as a two-line, two-phase system in practical applications.

SUMMARY OF THE INVENTION

The present invention is directed to providing a programmable two-line, two-phase logic array that is fabricated by simply and directly implementing given logic in accordance with a two-line, two-phase system, instead of by designing circuitry based on synchronous logic and thereafter replacing it with the two-line, two-phase system based on the substitution of asynchronous logic.

An object of the present invention is to provide a programmable two-line, two-phase logic array that implements circuitry based on a two-line, two-phase system in practical use. Another object of the present invention is to provide a programmable two-line, two-phase logic array which is readily and logically designed on the basis of a two-line, two-phase system. These and other objects and novel features of the present invention will become more apparent by referring to the following description and appended drawings.

A brief description will subsequently be given of an exemplary embodiment of the invention as disclosed in the present application for a patent. More specifically, the programmable two-line, two-phase logic array of the invention receives a plurality of input signals each having two lines, operating in two phases, and provides output signals each having two lines, operating in two phases. Each output signal provides a logic function output. For each input signal line pair of first and second input lines, a third input line is generated by a logical combination of the signals of the input line pairs. Further, the output line pairs are connected by combinational logic to a codeword state detection line and a function output line. The three input lines of the logic array intersect the codeword state detection line(s) and the function output lines at programmable connection points at which each of a plurality of memory cells (switching elements) is formed. Whether or not the crossing lines are connected or disconnected depends on the memory cell at the programmable connection point.

The memory cells are switching elements that either connect the programmable connection points of the array of input lines and codeword state detection line(s) and function output lines or leave them disconnected them depending on the logic function that is to be programmed for the input signals. The connections can be mask programmable in the fabrication process or field programmable, for example.

With the aforementioned means, a two-line, two-phase logic circuit can directly be attained by the same technique as that which is used for obtaining a conventional PLA without designing circuitry based on the conventional synchronous logic before replacing it with two-line, two-phase circuitry.

BRIEF DESCRIPTION OF THE DRAWINGS

FIG. 2 is a truth table of the two-line, two-phase logic array.

DETAILED DESCRIPTION OF THE PREFERRED EMBODIMENT

Figure 1:
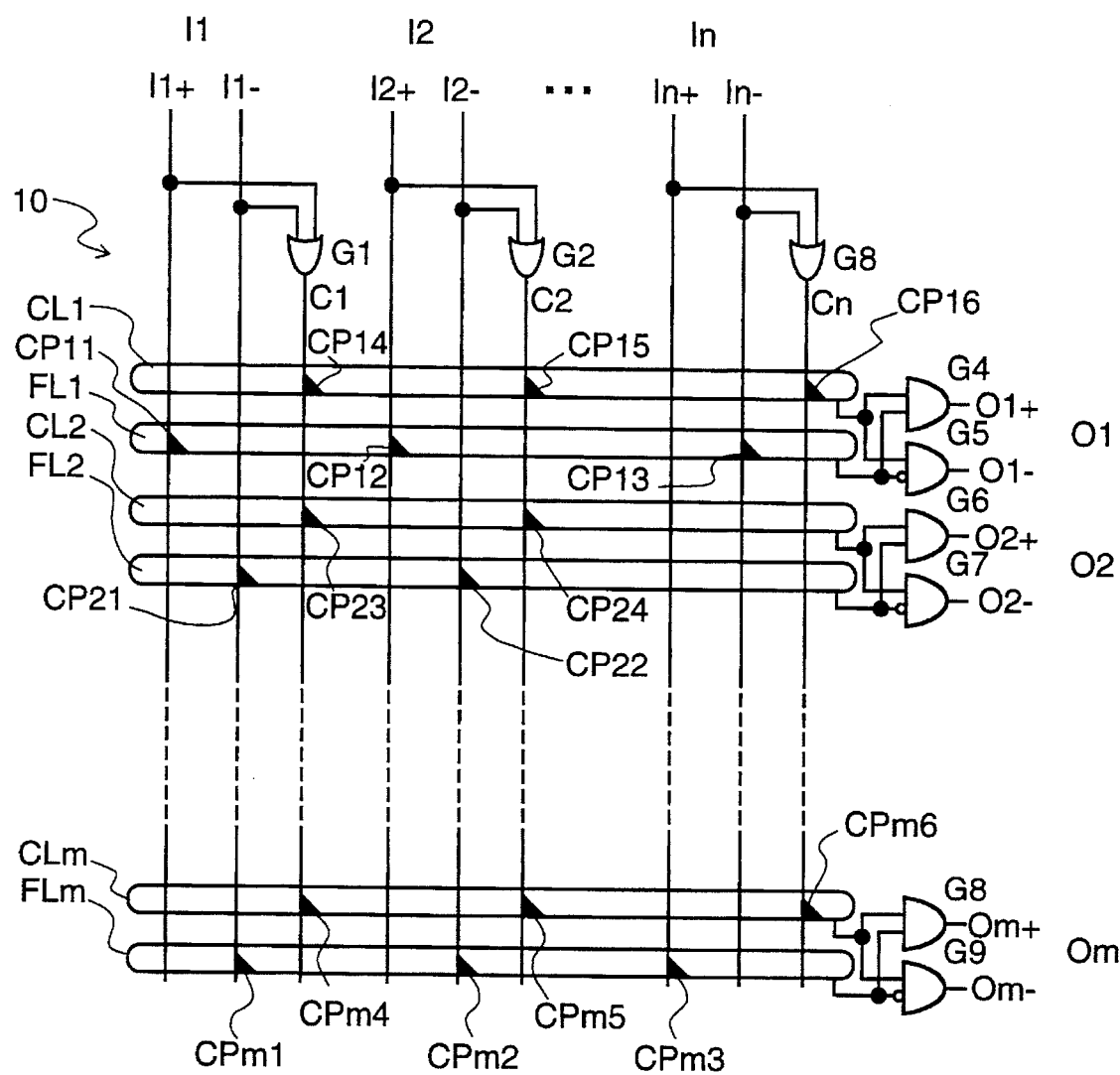
FIG. 1 is a schematic circuit diagram of a programmable two-line, two-phase logic array embodying the present invention.

FIG. 1 is a schematic circuit diagram of a programmable two-line, two-phase logic array 10 embodying the present invention. Each element of the circuit shown in FIG. 1 is prepared by any one of several known semiconductor integrated circuit fabrication techniques and formed on one semiconductor substrate of single crystal silicon, for example.

As shown in FIG. 1, the logic array receives a plurality of input signals (I1, I2, . . . In) extending in a vertical direction (as shown in the figure). The input signals are formed with two lines, each operating in a two-phase system, for example input signal lines I1+, I1− and I2+, I2− through In+, In−, where n is a variable indicating the number of input signals received by the array. Further, a state detection signal line (C1, C2 through Cn) for detecting the state of the two lines is generated from combinational logic respectively connected to the input line pairs. For example, the combinational logic shown in FIG. 1 for the state detection signal line C1 is formed with an OR gate circuit G1 for receiving the input signals I1+, I1−. As a result, the state detection signal line C1 is set to 0 when (I1+, I1−) are respectively set to (0, 0), which is the invalid state and in which no effective data exists, and is set to 1 in all other states of I1+, I1−.

The output lines are preferably arranged perpendicular to the input lines in practical application of the chip design. In FIG. 1, there are shown output lines O1, O2 through Om, where m is a variable indicating the number of output lines. Each of the output lines includes an output line pair O1+, O1− through Om+, Om− wherein each line of the pair operates in two pahases. Each of the output lines (Om+, Om−) is connected through combinational logic to a function output line FL and a codeword state detection line CL, identified by respective function output lines FL1 and FL2–FLm and codeword-state detection lines CL1 and CL2–CLm, according to the FIG. 1 embodiment of the invention.

The input lines, i.e. each of the input signal line pairs (I1+, I1−) through (In+, In−) as well as the state detection signal lines (C1, C2 through Cn) of the array cross or intersect the function output lines FL1–FLm and codeword state detection lines CL1–CLm, respectively at programmable connection points. Memory cells, not shown at each programmable connection point in the figures for clarity, selectively generate AND functions (contact points) at the programmable connection points designated by a triangle in the figures. The 1st function output line FL1, for example, is provided with contact points CP1–CP13 at which it intersects three input signals I1+, I2+ and In−, as representatively illustrated. When the memory cells are programmed to provide these contact points, the corresponding codeword-state detection line is provided with contact points CP14–CP16 at the programmable connection points where it respectively intersects the state-detection signal lines C1, C2 and Cn.

In the same manner, the 2nd function output line FL2 is provided with memory cells programmed to provide contact points CP21–CP22 at which line FL2 intersects the two input signal lines I1− and I2−, as shown. When the memory cells are are programmed to provide these contact points, the corresponding codeword-state detection line is provided with contact points CP23–CP24 at the programmable connection points where it intersects the state-detection signal lines C1 and C2. Further, the mth function output line FLm is provided with contact points CPm1–CPm3 at which it intersects the three input signals I1−, I2− and In+, as shown. When the memory cells are are programmed to provide these contact points, the corresponding codeword-state detection line CLm is provided with contact points CPm4–CPm6 CP24 at the programmable connection points where it intersects the state-detection signal lines C1, C2 and Cn.

The contact points mentioned above, as will be described later, are preferably formed with MOSFETs or the like having a gate connected to one of the input lines, which includes the input signal state detection lines; a source connected to ground; and a drain connected to the respective crossing line at the programmable connection point, which is either one of the function output lines FL1–FLm or one of the codeword state detection lines CL1–CLm. Whether the MOSFET is formed to be connected like this, depends on whether it is intended (by the logic function to be output) that a contact point be formed between the drain and the corresponding line after the MOSFETs are each formed at all of the contact points. The MOSFET is formed in this manner by either altering a mask pattern in the fabrication process or by electrically writing to the MOSFET.

Alternatively, the aforementioned memory cells may be made of MOSFETs having a stacked gate structure with a control gate and floating gate made so that the control gate selectively stores an electric charge. In this way, the MOSFET is steadily turned off by raising the threshold voltage with respect to a level at which the input signal line is selected or placed in the on/off state and power consumption is controlled by lowering the threshold voltage with respect to the level at which the input signal line is selected. The charge may selectively be injected into the floating gate in various modes where, for example, it can be injected by generating hot carriers in the vicinity of the drain and generating a great electromagnetic field between the gate and drain in the case of a known EPROM; or, for example, by forming a tunnel insulating film between the floating gate and the drain or source so as to cause the tunnel current to selectively flow therethrough.

A p-n junction diode, instead of a MOSFET formed as discussed above, may be fabricated at the programmable connection points in such a manner that a short-circuit is selectively caused between the input lines and the corresponding one of the function output lines and codeword state detection lines by applying a high voltage thereto in the reverse direction. That is, the p-n junction diode forms a fuse means that is selectively left intact or short-circuited at the programmable connection points.

The pair of output lines O1+, O1− of the output signal O1 are connected by combinational logic to the function output line FL1 and the codeword state detection line CL1. Gate circuits G4 and G5 provide the combinational logic, and as shown in FIG. 1, are AND gate circuits. The gate circuit G4 for forming the output signal O1+ is supplied with signals corresponding to the codeword-state detection line CL1 and the function output line FL1, whereas the gate circuit G5 for forming the output signal O1− is supplied with the codeword-state detection line CL1 and the inverted signal of the function output line ($\overline{FL1}$), as shown in FIG. 1.

The 2nd and mth output line pairs representatively illustrated are respectively connected to AND gate circuits G6 through G9 in their output portions to form output lines O2+, O2− through Om+, Om−. The even numbered gate circuits G6 and G8 for forming the signals of output lines O2+ and Om+ are respectively supplied with signals corresponding to the codeword-state detection lines CL2, CLm and the function output lines FL2, FLm, whereas the odd numbered gate circuits G7 and G9 for forming the signals of output lines O2− and Om− are respectively supplied with the codeword-state detection lines CL2, CLm and the inverted signals of the function output lines FL2, FLm.

FIG. 2 shows a truth table of the two-line, two-phase logic array having a specified logic function performed for the input signals that is determined by the contact points selectively formed by the memory cell at the programmable connection points. In reference to a first line of the table, on condition that any one of the three signals I1, I2 and In remains in the invalid state of (0, 0), the outputs O1+, O1− also remain invalid (0, 0). The outputs O1+, O1− are set to (1, 0), that is, "1" only when the inputs I1+, I1− are at (1, 0), that is, "0" The outputs O1+, O1− are set to (0, 1), that is, "0" at all other times. With respect to the 2nd and mth lines, the two-line, two-phase logic function shown in the truth table of FIG. 2 is output as a result of the programmong of the memory cells.

Figure 3:
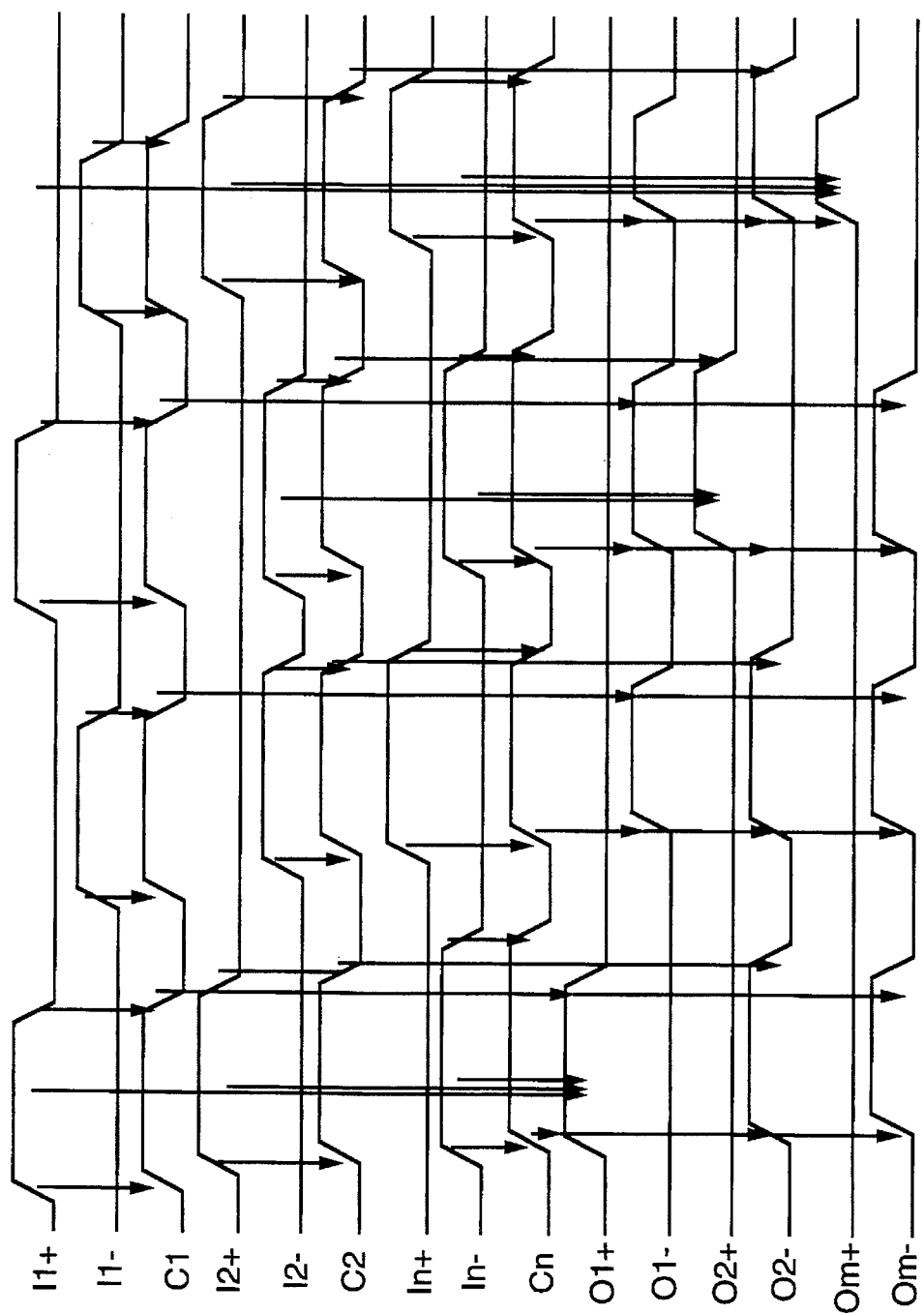
FIG. 3 is a waveform chart illustrating the operation of the two-line, two-phase logic array according to the present invention by way of example.

FIG. 3 is a waveform chart illustrating the operation of the two-line, two-phase logic array according to the present invention by way of example. As shown in FIG. 3, the state detection signal C1 corresponding to the input line signals I1+, I1− is set to a high level correspondingly when either one of the input line signals is set to the high level (by the OR gate G1). Then the codeword-state detection line CL1 controls the validity/invalidity of the output signal from the function output line FL1 according to the logic of the above input state detection C1 corresponding to the input signal. Consequently, an effective output signal is formed at a point of time when all the input signals are arranged in order without causing the output signal to be generated because of an input signal skew. Although the waveform chart of FIG. 3 has been discussed with respect to state detection signal C1 and input signals I1+, I1−, the chart also illustrates the waveforms for state detection signals C2–Cn and input line signals In+ and In− in a similar manner.

Figure 4:
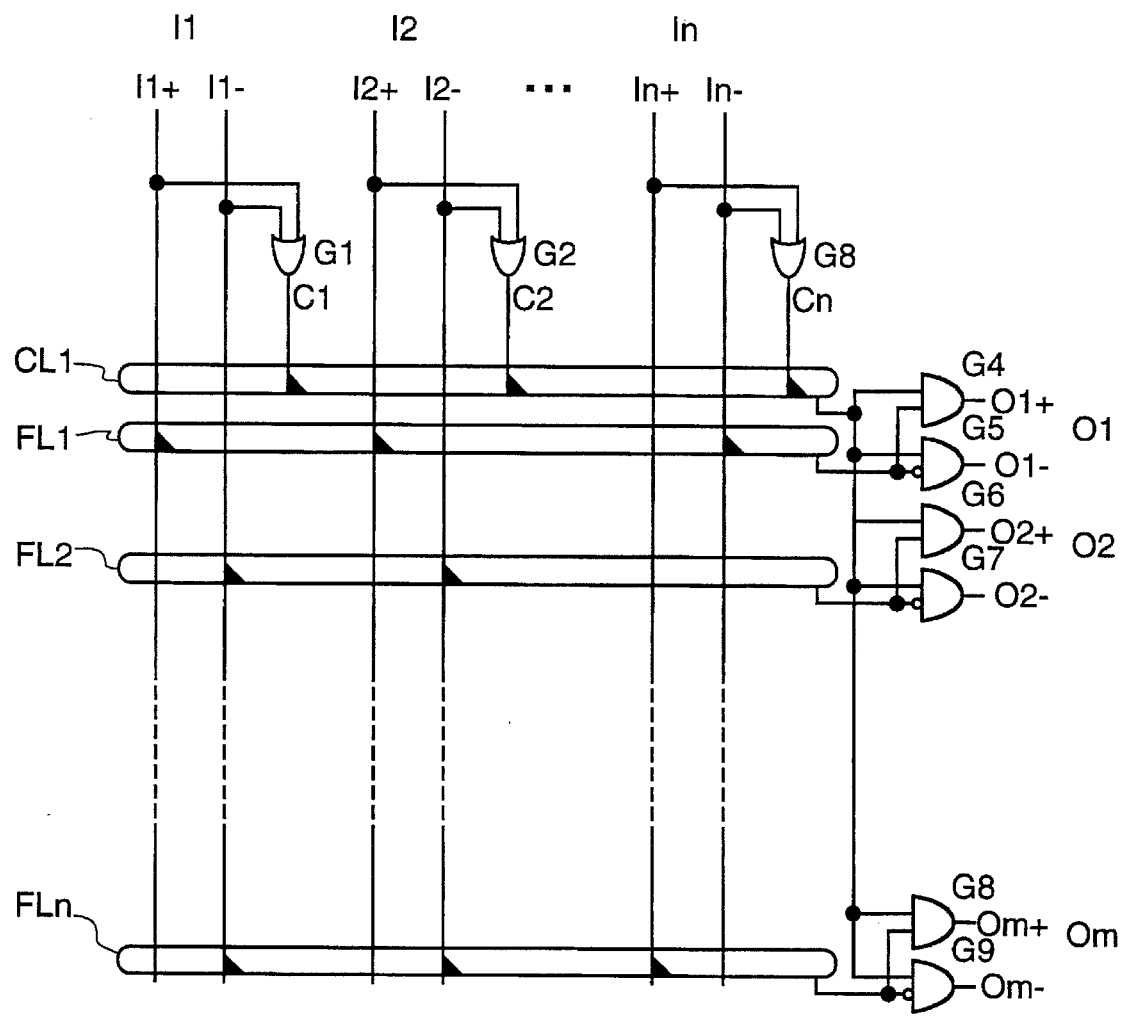
FIG. 4 is a schematic circuit diagram of another programmable two-line, two-phase logic array embodying the present invention.

FIG. 4 is a schematic circuit diagram of another programmable two-line, two-phase logic array embodying the present invention. In this embodiment of the invention, a codeword-state detection line CL1 is commonly used for a plurality of function output lines FL1–FLn. With this arrangement, the number of codeword-state detection lines can be reduced by a large margin and the output signal line pairs O1+, O1− through Om+, Om− can be output synchronously. In other words, the circuit according to this embodiment of the invention can be used to form a circuit that operates at high speed, whereas a conventional synchronous logic circuit is used to form a circuit portion that is not required to operate at such high speed. By the present embodiment, faults are prevented from being caused when the two-line, two-phase logic signal is converted to an ordinary binary signal.

Since the codeword-state detection line is commonly used for all of the function output lines in the practice of the embodiment of the invention shown in FIG. 4, there are contact points provided by the memory cells at all of the intersections of the codeword-state detection line CL1 and the state detection signal lines C1 through Cn corresponding to input signals I1+, I1− through In+, In−. Thus the codeword-state detection line CL1 is set at such a signal level that its valid state is established only when all of the state detection signals C1 through Cn of the input signals I1+, I1− through In+, In− remain valid. The pairs of gate circuits provided for each of the output lines O1+, O1− through Om+, O1− are similar to those shown in the embodiment of the invention referred to in FIG. 1 and the signal of the codeword-state detection line is a commonly used input for all of the pairs of gate circuits provided for all of the output lines.

Figure 5:
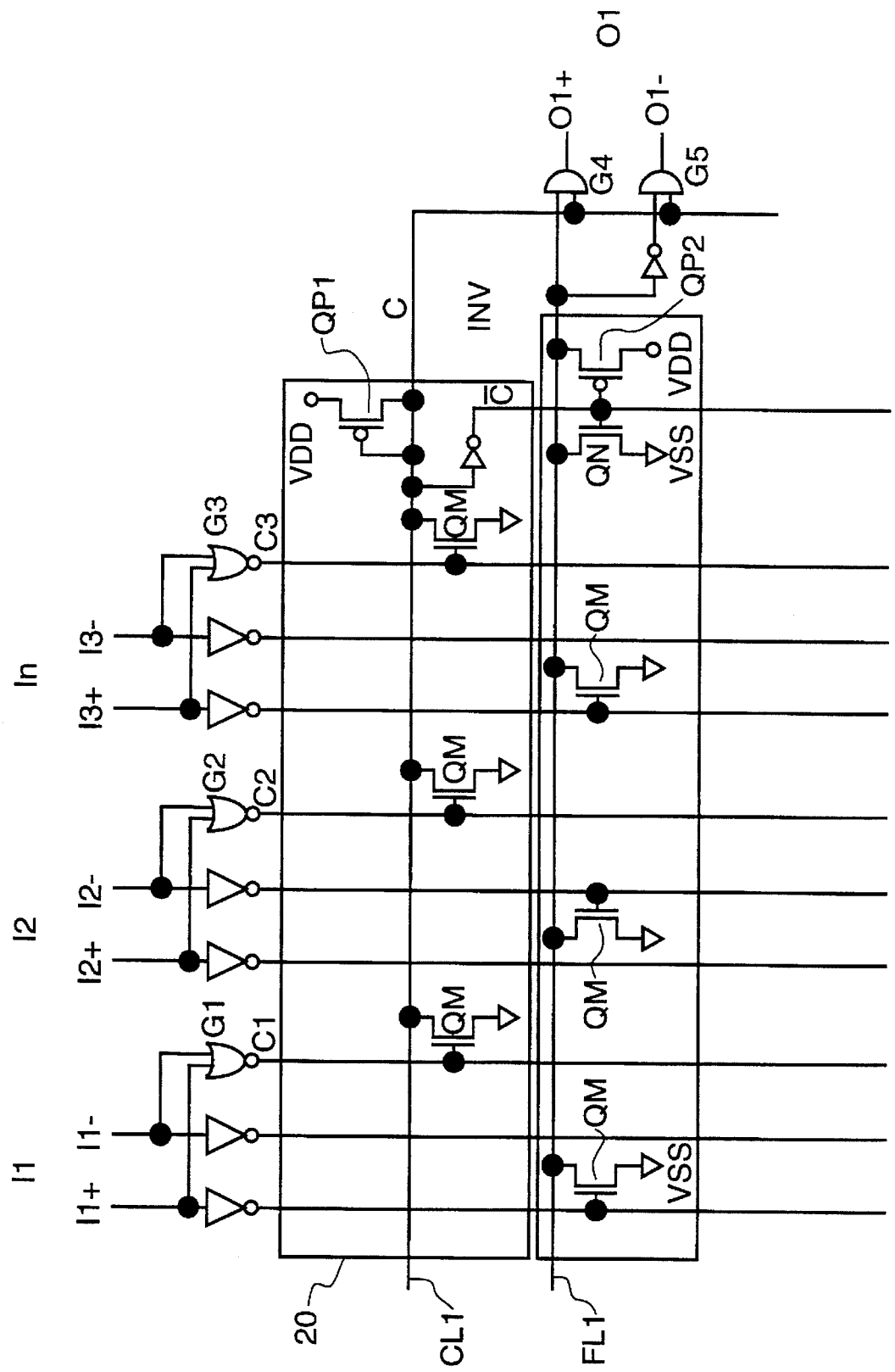
FIG. 5 is a specific circuit diagram of still another programmable two-line, two-phase logic array embodying the present invention.

FIG. 5 is a specific circuit diagram of still another programmable two-line, two-phase logic array embodying the present invention. In this embodiment of the invention, there are representatively illustrated, by way of example, three input lines I1–I3, respectively having input signals I1+, I1− through I3+, I3−, output line pairs O1+, O1− and at least one codeword-state detection line CL1 and a function output line FL1.

According to this embodiment of the invention, MOSFETs QM are preferably used that have their gates connected to an input line (vertical line), their drains connected to one of the function output line FL1 and the codeword state detection line CL1, and their sources connected to ground. Further, gate circuits for correspondingly forming the state detection signals C1 through C3 are formed with NOR gate circuits G1 through G3. As a result, when the two line and two-phase input signals I1+, I1− remain in the valid state of (1, 0) or (0, 1), the corresponding state detection signal C1 is set at a low level. Moreover, the input signals I1+, I1− through I3+, I3− are each inverted by inverter circuits before being supplied to the input lines.

While the three input signals I1+, I1− through I3+, I3−remain valid, the state detection signals C1 through C3 are set at a low level and the MOSFETs whose gates have been connected to the state detection signals C1 through C3 are turned off. Then the codeword-state detection line CL1 is set at a level almost as high as that of the power supply voltage VDD by a P-channel MOSFET QP1 as a load. The high-level signal is inverted by the inverter circuit and the inverted signal is supplied as $\overline{C}$ to the gate of a P-channel MOSFET QP2 as a load provided between the function output line FL1 and the power supply voltage VDD and to the gate of an N-channel MOSFET QN which is provided for resetting purposes between the function output line FL1 and the ground potential of the circuit. Incidentally, an over-bar is used in accordance with the conventional logic naming method to indicate that the low level is the active level.

Therefore, the inverted signal $\overline{C}$ is set to the low level and the load MOSFET QP2 is held ON when all of the input signals become valid on the function output line. Since the reset MOSFET QN is held OFF, further, there is obtained the function output signal corresponding to the ON state/Off state of the memory cells QM, the provision of which corresponds to the input signals. In other words, the MOSFET QM and the load MOSFET QP2 which becomes held ON by any one of the input signals causes direct current to steadily flow through these circuits (however, the direct current doesn't appear when there is no codeword present), thus preventing unnecessary power consumption by preventing the current from being dissipated needlessly.

The output signal of the codeword-state detection line CL1, the output signal of the function output line FL1 and the complemented function output signal which has been inverted by the inverter circuit INV are supplied to the AND gate circuits G4 and G5, whereby the two line and two-phase output signals O1+, O1− are formed. In this case, a Boolean equation may be used to express the output signal as O1=I1·$\overline{I2}$·I3.

Figure 6:
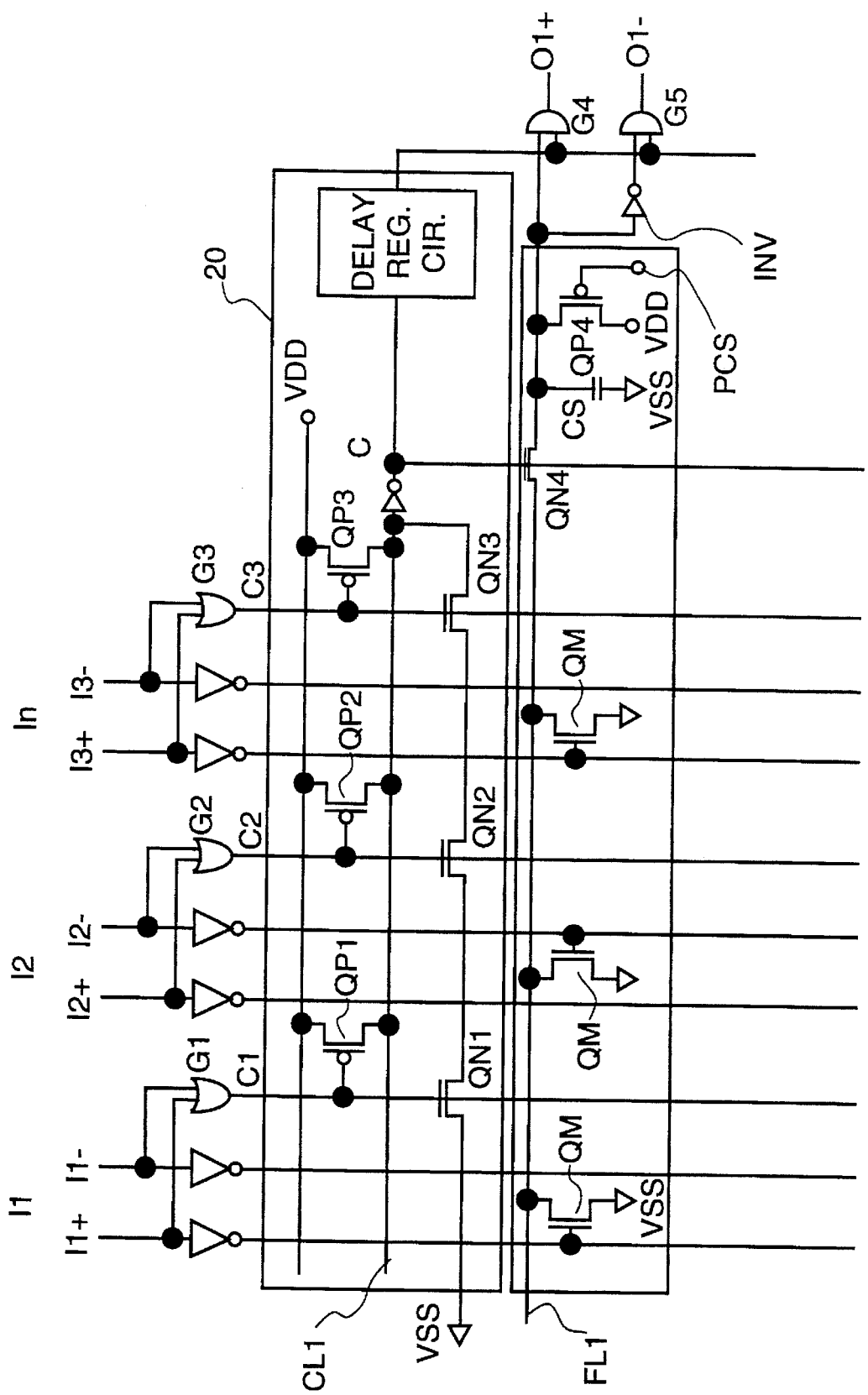
FIG. 6 is a specific circuit diagram of still another programmable two-line, two-phase logic array embodying the present invention.

FIG. 6 is a specific circuit diagram of still another programmable two-line, two-phase logic array embodying the present invention. This embodiment of the invention also corresponds, though is not necessarily limited, to that which is shown in FIG. 5, wherein there are representatively illustrated three input signals I1–I3 having respective input signal lines I1+, I1− through I3+, I3−, and one codeword-state detection line CL1 and a function output line FL1 for common use that are connected through combinational logic to provide output signal line pairs O1+, O1−.

In the practice of this embodiment of the invention, a codeword-state detection circuit 20 is formed with CMOS. More specifically, the output of a NOR gate circuit is set to the high level when any one of the inputs remains invalid on the codeword-state detection line, and a MOSFET QM is turned on so as to allow direct current to flow between the NOR gate circuit and the load MOSFET QP1 shown in FIG. 5. Consequently, P-channel MOSFETs QP1 through QP3 each corresponding to a pair of input lines are provided between the codeword-state detection line CL1 and power supply voltage VDD, and state detection signals C1 through C3 are each supplied to their gates. Then N-channel MOSFETs QN1 through QN3, which are as many in number as the corresponding input lines, are connected in series between the codeword-state detection line and the ground potential of the circuit. The state detection signals C1 through C3 are each supplied to their gates.

In other words, these P-channel MOSFETs QP1 through QP3 and N-channel MOSFETs QN1 through QN3 form NAND gate circuits of CMOS with the state detection signals C1 through C3 as input signals and also form a low level output signal when all of the state detection signals C1 through C3 are set to a valid level. For this reason, the logic gate circuits forming each of the state detection signals C1 through C3 are formed with OR gates in place of the NOR gates shown in FIG. 5.

Since the level of the codeword-state detection signal is reversed as compared with the practice of the invention referred to in FIG. 5, a detection signal C is output through the inverter circuit. The detection signal C is applied to the gate of an N-channel MOSFET QN4 provided in series between the function output line FL1 and a precharge circuit as will subsequently be described. More specifically, the MOSFET QN4 is turned off while the signal C remains invalid at the low level and separates the precharge circuit from the function output line to prevent direct current from being wastefully dissipated between the precharge circuit and the function output line.

The precharge circuit is formed with a P-channel MOSFET QP4 for receiving a precharge control signal PCS. The detection signal C of the codeword-state detection circuit or any other suitable control signal may be utilized, for example, as the precharge control signal.

The P-channel MOSFET QP4 is turned on before all of the input signals become valid and causes a capacitor CS to be charged up to a high level equivalent to that of the power supply voltage VDD. Then, all of the input signals become valid and the N-channel MOSFET QN4 provided between the function output line and the precharge circuit is turned on, so that the capacitor CS is discharged when any one of the memory cells QM is turned on to form a low-level output signal. While, moreover, all the memory cells QM provided for the function output line are held OFF, a signal remaining at the precharge level is directly output.

More specifically, the function output line in this embodiment of the invention does not utilize the ratio logic in which the output level is determined by the conductance ratio between the load MOSFET QP2 and MOSFET QM forming the memory cell as in the embodiment of the invention referred to in FIG. 5, but rather uses a ratio-less logic (dynamic type) in which the output level is determined by whether or not the precharge level is discharged according to the input signal. A delay regulating circuit shown in FIG. 6 is used to form the delay time corresponding to the discharge time and to transmit the output signal of the codeword-state detection circuit to the output gate circuits G4, G5, so that the two line, two-phase output signal, e.g. O1+ and O1−, is formed in substantial conformity with the timing at which the output signal of the function output line is decided.

Figure 7:
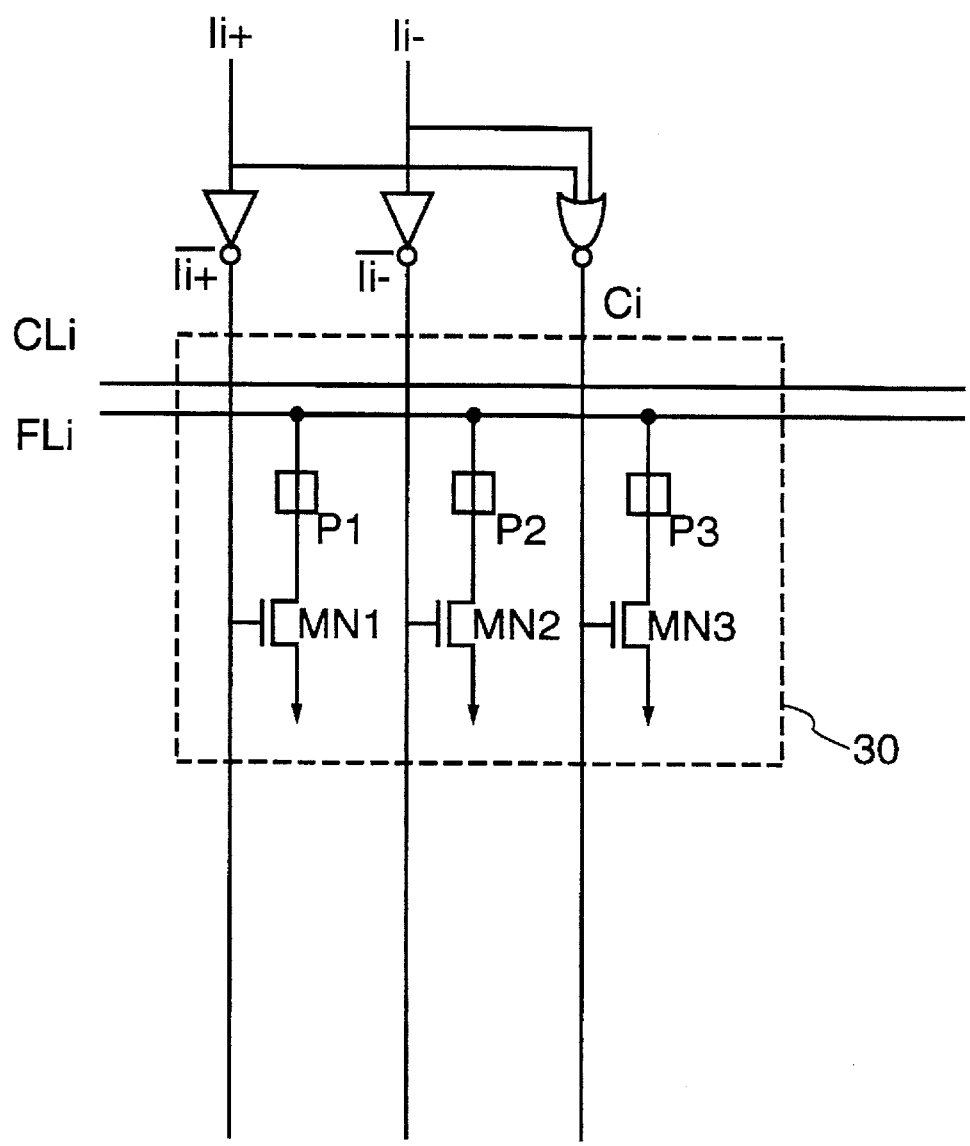
FIG. 7 is an equivalent circuit diagram of a unit cell in the programmable two-line, two-phase logic array according to the present invention.

FIG. 7 is an equivalent circuit diagram of a unit cell in the programmable two-line, two-phase logic array according to the present invention. In FIG. 7, there is representatively illustrated a unit circuit 30 including the lines CLi, FLi of the aforementioned codeword-state detection circuit and the function output line, resectively, and memory cells MN1 through MN3 each at the intersections of the input lines and lines Cli, FLi. Further, programmable devices P1 through P3, i.e. fusible links, are provided between the drains of the memory cells MN1 through MN3 and the corresponding output lines, respectively. More specifically, the programmable devices P1 through P3 are each provided with, according to a preferred embodiment, programmable contacts for selectively connecting the drains of the memory cells MN1 through MN3 and the corresponding codeword state detection or output function lines or otherwise providing fuses therebetween.

Figure 8:
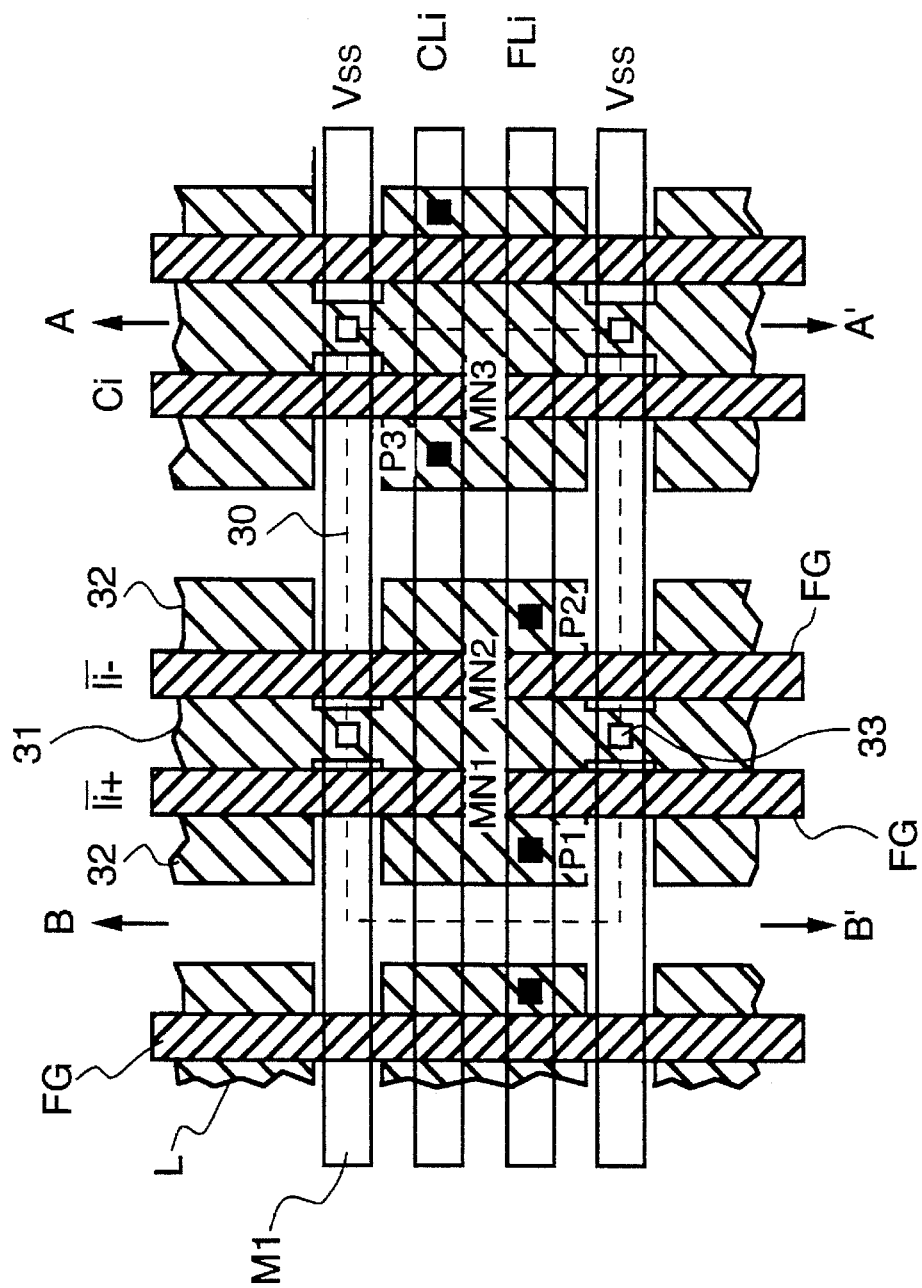
FIG. 8 is a layout of the unit cell shown in FIG. 7.

FIG. 8 shows a layout of the unit cell shown in FIG. 7 above. The portions L shown by oblique lines in FIG. 8 are semiconductor regions forming the source regions 31 and drain regions 32 of the memory cells MN1 through MN3. As shown in the figure, a polysilicon layer FG forms, respectively, the gate electrodes of the memory cells MN1 through MN3 and thus receives the input signal lines $\overline{I}$i+, $\overline{I}$i−. As shown in FIG. 8, there is shown a horizontally extending first metal wiring layer M1, which denotes a source grounding line VSS connected to the source region of the memory cells MN1 through MN3 by the contacts 33. The codeword-state detection line of the codeword-state detection circuit (FIG. 6) and the function output line are formed in the same metal wiring layer M1, according to a preferred embodiment, held between and in parallel with the pair of source grounding lines VSS.

The unit cell comprises the three MOSFETs MN1 through MN3. The two memory cells MN1 and MN2 corresponding to the function output line FLi have a common source region 31, whereas their drain regions 32 are horizontally distributed to hold their gates therebetween (as shown in the figure). Programmable contacts P1 and P2 are selectively formed in these drain regions so as to connect the drain and the corresponding function output line FLi. The remaining one memory cell MN3 included in the unit cell and another one similar to the former in the adjoining unit cell form a pair. In other words, the source is commonly provided for the memory cells in the unit cells adjacent to each other and the drain regions are horizontally distributed with the respective gate electrodes held therebetween. The drain of the memory cell MN3 is shown to be selectively connected by the programmable contact points P3 to the the codeword-state detection line Cli of the codeword-state detection circuit.

The logic array according to this embodiment of the invention is arranged longitudinally and symmetrically about the source line A–A' and with respect to line B–B' as shown by the arrows in FIG. 8 (mirror inversion). There are formed unit cells adjacent to each other horizontally and symmetrically. By repeating this pattern, it is possible to form a highly integrated programmable two-line, two-phase logic array despite the fact that the unit cell is formed of only three memory cells.

Figure 9:
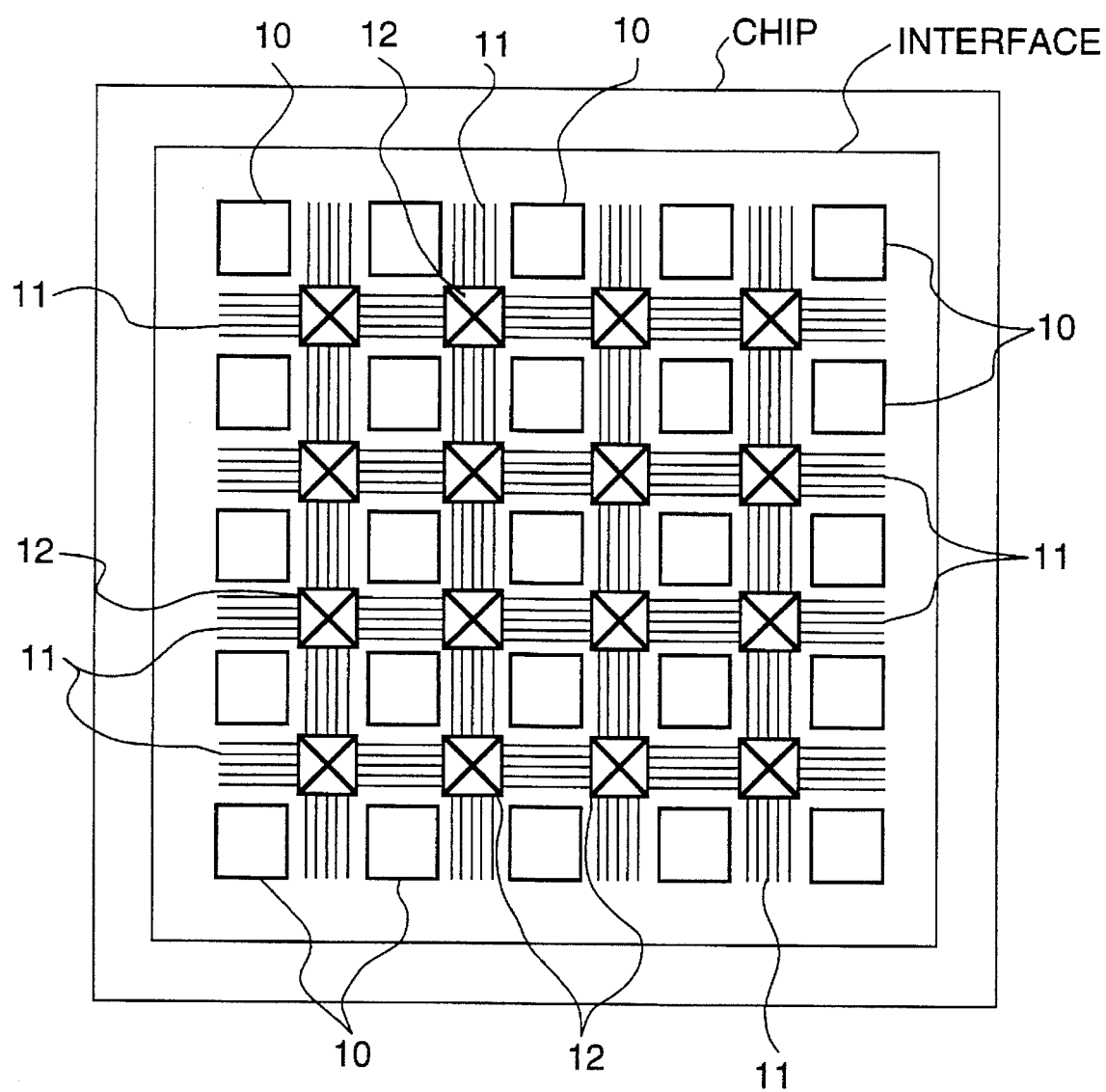
FIG. 9 is a schematic block diagram of a semiconductor integrated circuit equipped with the logic arrays according to the present invention.

FIG. 9 is a schematic block diagram of a semiconductor integrated circuit equipped with the logic arrays 10 formed according to the present invention. In this embodiment of the invention, the whole logic of the semiconductor integrated circuit is formed with, though not limited to, a two-line, two-phase logic array. In order to feasibly form a complicated logic circuit relatively simply and for a general purpose, a plurality of logic arrays 10 of the invention are arranged vertically and horizontally on a semiconductor chip. More specifically, five of them are arranged vertically and five horizontally. Accordingly, 25 of the logic arrays of the invention are arranged in the form of a matrix.

Further, a wiring channel 11 is arranged vertically and horizontally between the logic arrays 10 of the invention. In other words, a plurality of wiring channels are formed in parallel to each other. A programmable switch matrix 12 is provided at the intersections of the vertically and horizontally extending sections of the wiring channel 11. The programmable switch matrix 12 can be formed from any suitable elements, such as with contacts for connecting the vertically and horizontally extending wires.

In a case where the logic of the logic array is decided so that the contact points are selectively provided between the memory cell and the output lines as in the case of a mask programmable ROM, such programmable switch matrices are connectable through the same process step and it is convenient to fabricate the logic arrays together with the switch matrices.

The programmable switch matrix 12 may be formed with MOSFETs. That is, according to such an arrangement, a MOSFET is used as a switching element for deciding whether to extend the wiring vertically or horizontally, and such a MOSFET may also be used together with another switch MOSFET for deciding whether to connect the vertical and horizontal wires. The signal for controlling the MOSFET may be supplied in various ways, for example, by writing (addressing) the set signal serially applied from an external terminal of static RAM, or by selectively shorting fuses so as to set the ON state/OFF state or the like. When a MOSFET switching element like this is used, the circuit of the switch matrix becomes complicated on the one hand, but the wiring channel can be easily set up on the other hand, which may be advantageous in certain applications.

An input signal is supplied from the wiring channel 11 to the logic arrays 10 and an output signal is sent out through the wiring channel 11. With the combination of the wiring channel and the switch matrix, a signal can be transmitted from and to any given logic array. Further, an interface circuit that provides an interface with circuitry external of the chip is provided in the peripheral portion of the semiconductor chip, as shown schematically. As an interface for forming an output signal designed for a synchronous circuit outside the chip, the logic array shown in FIG. 4 may be used.

Figure 10:
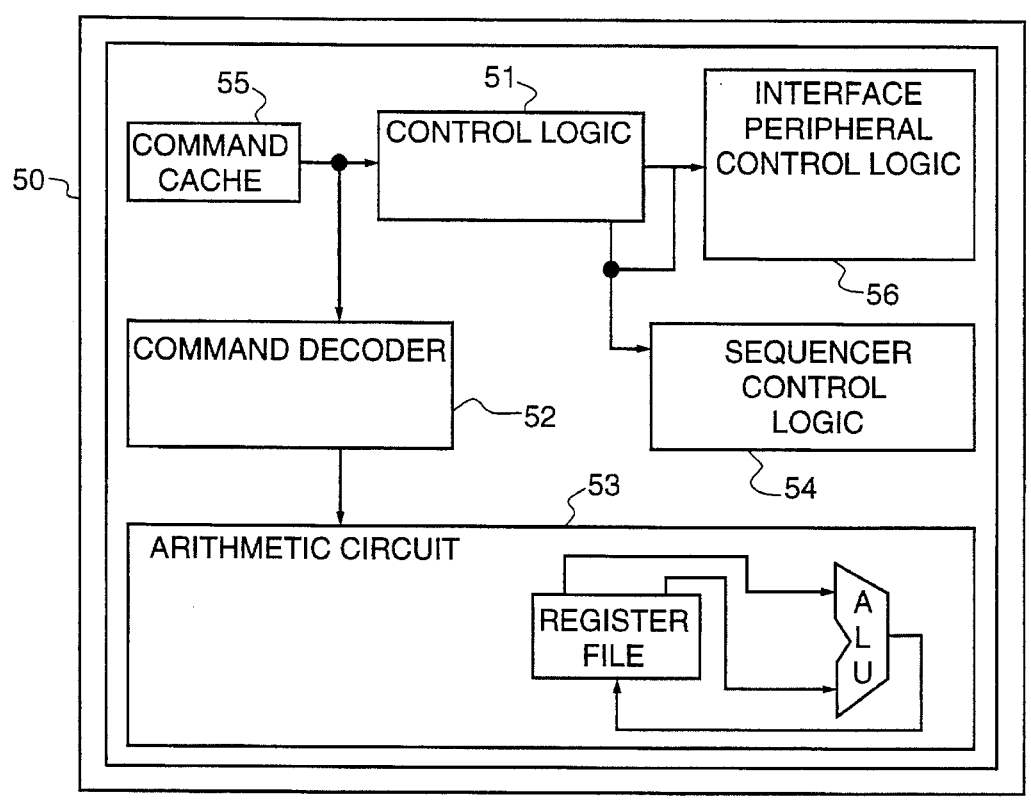
FIG. 10 is a schematic block diagram of a microprocessor to which the present invention is applicable.

FIG. 10 is a schematic block diagram of a single chip microprocessor 50 to which the present invention is applicable. The two-line, two-phase logic array 10 according to the present invention is utilized for a control logic unit 51 and a command decoder unit 52. A synchronous logic circuit 53 is used for forming an arithmetic circuit, a sequencer control logic unit 54, a command cache 55 and an interface 56 for providing external connections to outside of the chip, for example a peripheral control logic unit, for example. The two-line, two-phase logic array according to the present invention is employed for the control logic 51 and the command decoder unit 52 which require the highest operating speed in executing the commands of the microprocessor, so that high-speed operation exceeding the operating limit by the clock skew and the like of the synchronous circuit can be achieved.

Figure 11:
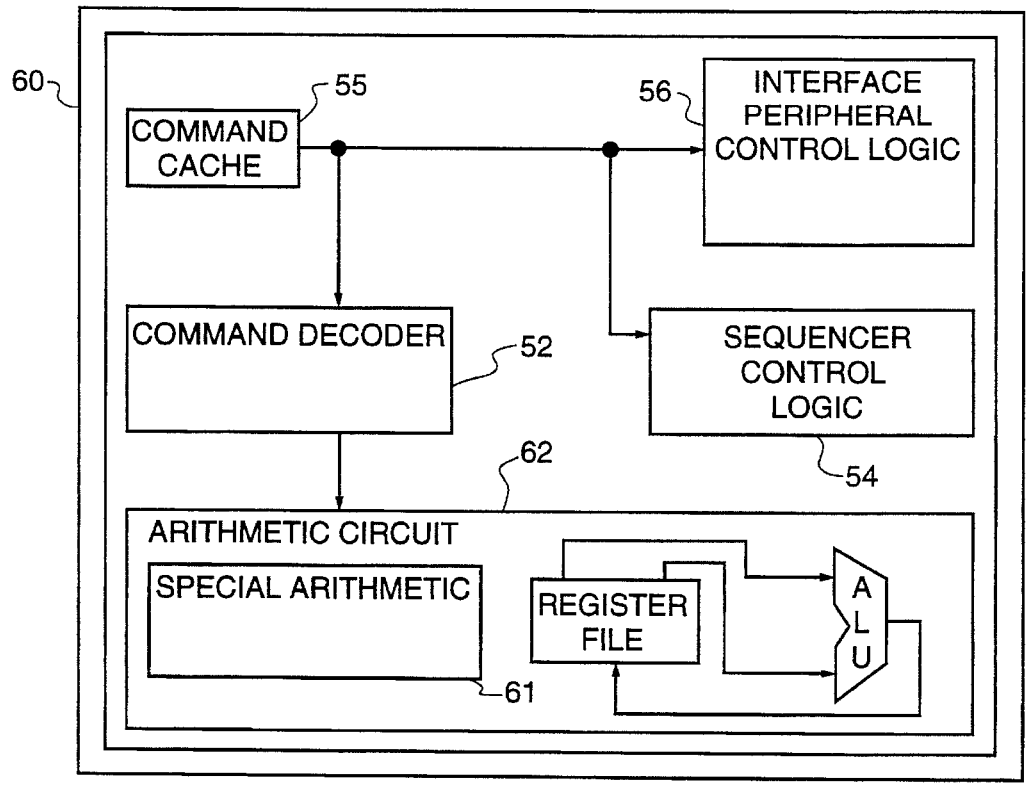
FIG. 11 is a schematic block diagram of another microprocessor to which the present invention is applicable.
Figure 12:
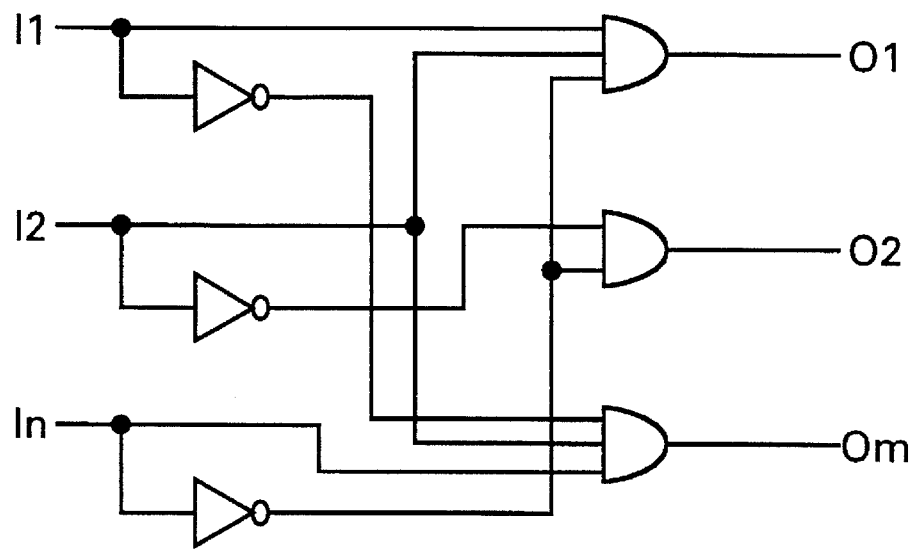
FIG. 12(a) is an ordinary logic circuit.
FIG. 12(b) is a corresponding logic circuit diagram implemented in a two-line, two-phase system.
Figure 12:
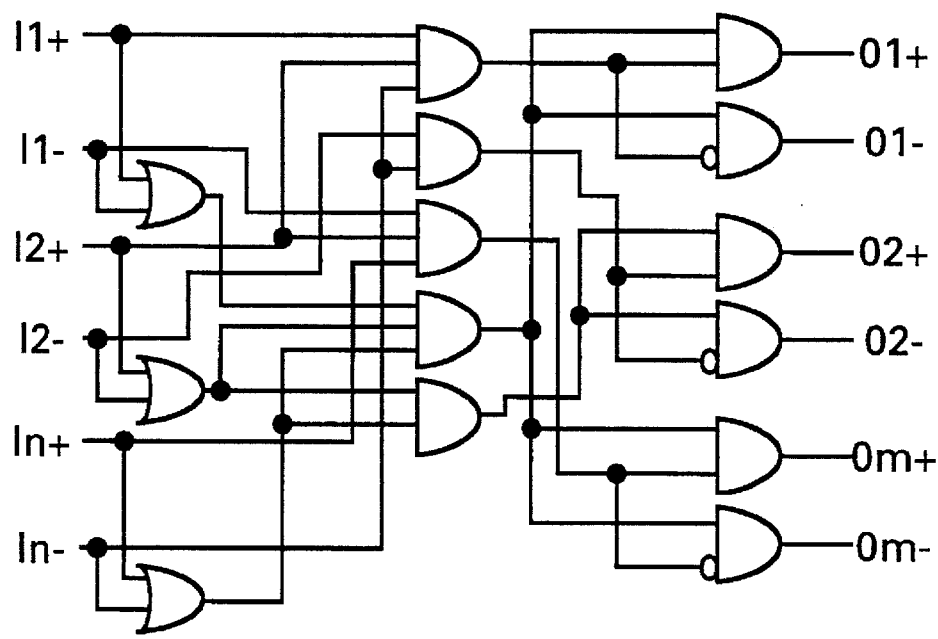
Figure 13:
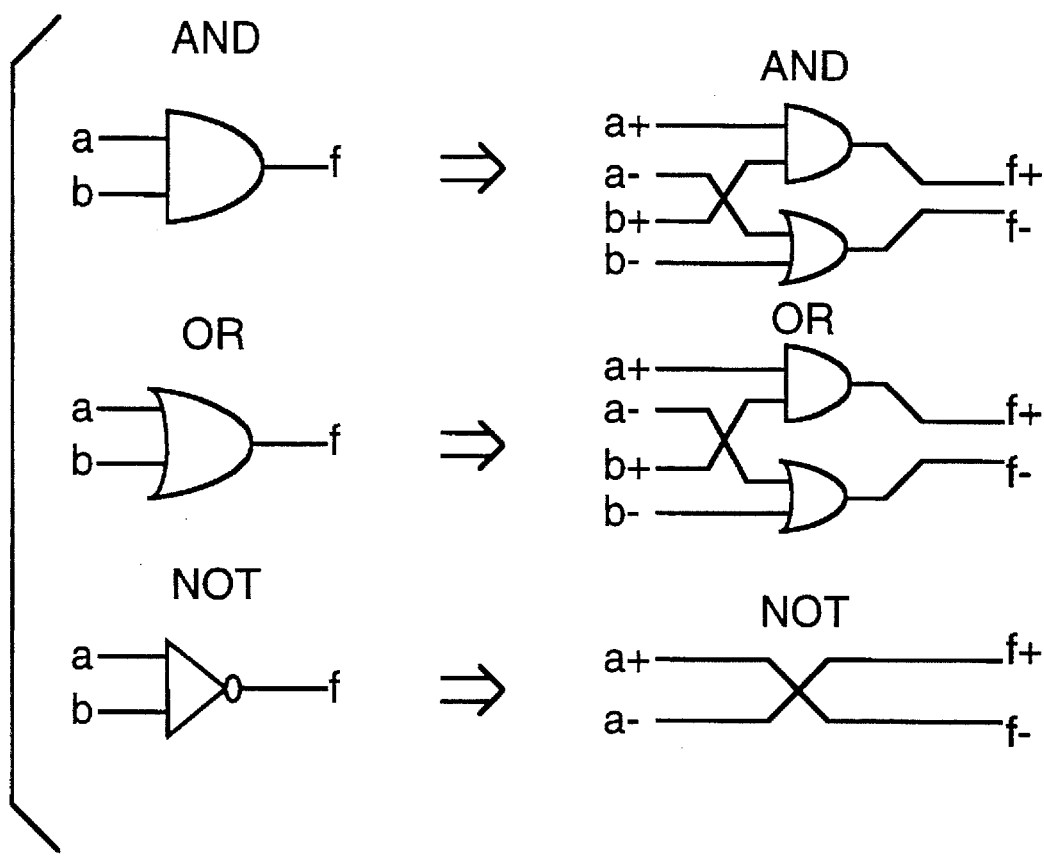
FIG. 13 is a conventional ordinary unit gate circuit diagram in a two-line, two-phase system.

FIG. 11 is a schematic block diagram of another microprocessor 60 to which the present invention is applicable. The two-line, two-phase logic array according to the present invention is utilized for a special arithmetic unit 61 provided in an arithmetic circuit 62. In order for the user to be freely provided with a special computing function, the two-line, two-phase logic array according to the present invention is utilized. In other words, special attention is directed to logic determination in a programmable mode in addition to the high-speed operation of the two-line, two-phase logic array in this practice of the invention. The practice of the invention shown in FIG. 10 may be combined with that which is shown in FIG. 11, and therefore the same reference numbers are used to designate like components thereof.

The following effects of the invention are attained by the aforementioned embodiments thereof.

(1) Two-line, two-phase logic circuitry is fabricated using semiconductor fabrication techniques that are similar to those used in conventional PLA design without requiring the steps of designing circuitry based on conventional synchronous logic which is then replaced with two-line, two-phase circuitry. This is achieved by the provision of an array having a plurality of input signals each having two lines operating in two phases, and input state detection signal lines generated as a third input line by combinational logic connected to the two phase input lines. Memory cells are provided at the intersections of the input lines (In+, In− and Cn) and at least one function output line and codeword detection line FLi, CLi arranged perpendicularly to the input lines which are logically combined to form the output lines Om+, Om−. The memory cells are capable of being written in the fabrication process (mask programmable) or by electrical programming, and used for forming a two-line, two phase logic function output for the input signals.

(2) In the practice of the embodiments of the invention achieving the benefits referred to in (1), the invention further provides the benefit of making it easy to design a two-line, two-phase logic circuit, thus promoting the use of the two-line, two-phase logic circuitry for general and special applications.

(3) According to the preferred embodiments, at least one function output line is provided that is arranged to cross the input lines and a codeword-state detection line that is provided for detecting the codeword state corresponding to the function output. The memory cells each of which is provided at an intersection of the input lines (including the input signal state detection line) and crossing lines (including the function output and codeword detection lines) are capable of being written by a fabricating process (mask programming) or by field programming (an electrical programming process, for example). According to the preferred practice of the invention, therefore, a two-line, two-phase logic circuit can be simply attained.

(4) According to another preferred embodiment of the invention, a two-line, two-phase logic circuit is attained that provides a synchronized output signal.

(5) With the provision of the function output line provided with a load MOSFET which is turned off when it is made invalid by the codeword-state detection signal, the current is prevented from being dissipated so power consumption is reduced.

(6) With the provision of an output switch MOSFET that is turned off when it is made invalid by the codeword-state detection signal between the function output line and the output node where the precharge circuit is provided, the power consumption is maintained at minimum levels.

(7) A plurality of programmable two-line, two-phase logic arrays can be arranged in the form of a matrix on a semiconductor substrate having wiring channels formed of a plurality of wires arranged in parallel to each other vertically and horizontally among the logic arrays. A programmable switch matrix is also provided for connecting given vertical and horizontal wiring channel sections at the intersections thereof.

Although a detailed description has been given of the embodiments of the present invention, the disclosed embodiments may be modified in various ways without departing from the scope and spirit of the invention. For example, the logic array may be formed of an array of OR gates rather than the disclosed array of AND gates. In such a programmable microprocessor as mentioned above, for example, a control signal may be formed by selecting one function output line by means of an AND array, and supplying the output signal of the function output line so as to form such a control signal to be transmitted to a control field for attaining the basic operation including producing the next address and making calculations.

When the logic array is fabricated with a mask ROM using MOSFETs, a vertical ROM may be used instead of the horizontal ROM referred to in the embodiments of the invention set forth above. In other words, the codeword state detection line and the function output line are formed with a series of MOSFETs with their gates each connected to the plurality of input lines. The present invention is also applicable to various digital circuits that can be implemented using two-line, two-phase logic arrays.

We claim:

1. A programmable two-line, two-phase logic array comprising:

said logic array receiving a plurality of input signals each having first and second input lines operating in two phases and an input signal state detection line logically connected to said first and second input lines that forms a third input line corresponding to each of said received input signals;

a plurality of output signals each having a pair of output lines operating in two phases, each of said pair of output lines being logically connected to at least one codeword state detection line and a function output line, the pairs of output lines providing a predetermined two-line, two phase logic function output for said input signals;

each of said input lines crossing said function output lines and said input signal state detection lines crossing said at least one codeword state detection line at programmable connection points; and a plurality of memory cells each of which is provided at the programmable connection points, said memory cells being programmable to selectively connect or disconnect corresponding ones of said input lines with said function output lines and said input state detection signal lines with said at least one codeword state detection line to generate said predetermined logic function.

2. The programmable two-line, two-phase logic array according to claim 1, further including a plurality of said codeword state detection lines that cross said input signal state detection lines at said programmable connection points, each of said codeword state detection lines corresponding to one of said output signals.

3. The programmable two-line, two-phase logic array according to claim 1, further including only one said at least one codeword state detection line.

4. The programmable two-line, two-phase logic array according to claim 1, wherein each of said memory cells is a MOSFET having a gate connected to one of said input lines, one of a source and a drain connected to a corresponding one of said at least one codeword state detection line and said function output line, and the other of said source and drain connected to ground.

5. The programmable two-line, two-phase logic array according to claim 1, wherein said first and second input lines of each of said input signals are connected to inputs of an OR gate, and wherein an output of said OR gate forms said input signal state detection line.

6. The programmable two-line, two-phase logic array according to claim 1, wherein said at least one codeword state detection line and said function output line for each of said output signals is connected to inputs of first and second AND gates respectively corresponding to said pair of output lines and wherein one of said first and second AND gates receives an inverted output of a corresponding one of said function output lines.

7. The programmable two-line, two-phase logic array according to claim 1, further including: a plurality of said logic arrays arranged in matrix form on a semiconductor substrate, wiring channels having a plurality of wires arranged parallel to one another connecting said plurality of logic arrays together and extending in a grid pattern crossing one another at programmable switching points; and a programmable switch matrix for selectively connecting predetermined ones of said wires of said wiring channels at said programmable switching points.

8. A programmable two-line, two-phase logic array comprising:

said logic array receiving a plurality of input signals each having first and second input lines operating in two phases and an input signal state detection line logically connected to said first and second input lines corresponding to each of said received input signals;

at least one output signal having a pair of output lines operating in two phases;

a codeword state detection circuit providing a codeword state detection line output that includes said input signal state detection lines crossing at least one codeword state detection line at first programmable connection points;

each of said input lines crossing at least one of a plurality of function output lines corresponding to said at least one output signal at second programmable connection points;

said pair of output lines being logically connected to said at least one codeword state detection line and said at least one function output line;

a plurality of memory cells each of which is provided at said first and second programmable connection points, said memory cells being programmable to selectively connect corresponding ones of said input lines with said at least one function output line and said input signal state detection line with said at least one codeword state detection line whereby said predetermined logic function is selectively programmed;

a first load switching device connected between said at least one codeword state detection line and a supply voltage that is switched to ON when a codeword is present on said at least one codeword state detection line;

a second load switching device connected between said at least one function output line and the supply voltage that is switched to ON when all of the input signals become valid on said at least one function output line; and said at least one codeword state detection line and said at least one function output line corresponding to said at least one output signal is connected to inputs of first and second AND gates having outputs respectively connected to said pair of output lines.

9. The programmable two-line, two-phase logic array according to claim 8, further including a third switching device providing a resetting function connected between said at least one function output line and ground that is switched to OFF when all of the input signals become valid on said at least one function output line.

10. The programmable two-line, two-phase logic array according to claim 8, wherein said input signal state detection lines are formed from outputs of NOR gate circuits receiving said first and second input lines as inputs received through inverter circuits.

11. The programmable two-line, two-phase logic array according to claim 9, wherein said first and second load switching devices are P-channel MOSFETs and said third switching device is an N-channel MOSFET.

12. The programmable two-line, two-phase logic array according to claim 8, wherein one of said first and second AND gates receives an inverted output of said at least one function output line.

13. The programmable two-line, two-phase logic array according to claim 8, wherein each of said memory cells is a MOSFET and wherein said first programmable connection points selectively connect a first plurality of said MOSFETs so that a gate is connected to one of said input signal state detection lines, one of a source and a drain is connected to said at least one codeword state detection line, and the other of said source and drain is connected to a supply voltage, and wherein said second programmable connection points selectively connect each of said second plurality of MOSFETs so that a gate thereof is connected to one of said input lines, one of a source and a drain thereof is connected to said at least one function output line, and the other of said source and drain thereof is connected to ground.

14. The programmable two-line, two-phase logic array according to claim 8, further including: a plurality of said logic arrays arranged in matrix form on a semiconductor substrate, wiring channels having a plurality of wires arranged parallel to one another connecting said plurality of logic arrays together and extending in a grid pattern crossing one another at programmable switching points; and a programmable switch matrix for selectively connecting predetermined ones of said wires of said wiring channels at said programmable switching points.

15. A programmable two-line, two-phase logic array comprising:

said logic array receiving a plurality of input signals each having first and second input lines operating in two phases and an input signal state detection line logically connected to said first and second input lines corresponding to each of said received input signals;

at least one output signal having a pair of output lines operating in two phases;

a codeword state detection circuit providing a codeword state detection line output that includes said input signal state detection lines crossing at least one codeword state detection line at first programmable connection points;

each of said input lines crossing at least one of a plurality of function output lines corresponding to said at least one output signal at second programmable connection points;

said pair of output lines being logically connected to said at least one codeword state detection line and said at least one function output line;

a first plurality of MOSFETs forming first memory cells each of which is provided at said first programmable connection points and a second plurality of MOSFETs forming second memory cells each of which is provided at said second programmable connection points, said first plurality of MOSFETs being programmable to selectively connect corresponding ones of said input signal state detection lines with said at least one codeword state detection line and said second plurality of MOSFETs being programmable to selectively connect said input lines with said at least one function output line, whereby a predetermined logic function is selectively programmed, a third plurality of MOSFETs connected in series between said at least one codeword state detection line and ground;

an inverter circuit for inverting an output of said at least one codeword state detection line, wherein said first and third plurality of MOSFETs and said inverter circuit form a low level output on said at least one codeword state detection line when all of the input state detection signal are set to a valid level;

a precharge circuit receiving a precharge control signal;

a switching device provided in series between said at least one function output line and said precharge circuit that is turned off while a signal remains invalid on said at least one codeword state detection line and that separates said precharge circuit from said at least one function output line to prevent direct current from being dissipated between said precharge circuit and said at least one function output line, whereby said precharge circuit is turned on before signals on all of said input lines become valid and causes a capacitor to be charged up to a high level so that if all of the signals on said input lines become valid and the switching device is turned on, said capacitor is discharged when any one of said second memory cells is turned on to form a low-level output signal on said at least one function output line.

16. The programmable two-line, two-phase logic array according to claim 15, wherein each of said first plurality of MOSFETs has a gate connected to one of said input signal state detection lines, one of a source and a drain connected to said at least one codeword state detection line, and the other of said source and drain connected to a supply voltage and wherein each of said second plurality of MOSFETs has a gate connected to one of said input lines, one of a source and a drain connected to at least one function output line, and the other of said source and drain connected to ground.

17. The programmable two-line, two-phase logic array according to claim 15, wherein said input signal state detection lines are formed with OR gates receiving inputs of said first and second input lines.

18. The programmable two-line, two-phase logic array according to claim 15, further including: a plurality of said logic arrays arranged in matrix form on a semiconductor substrate, wiring channels having a plurality of wires arranged parallel to one another connecting said plurality of logic arrays together and extending in a grid pattern crossing one another at programmable switching points; and a programmable switch matrix for selectively connecting predetermined ones of said wires of said wiring channels at said programmable switching points.

19. The programmable two-line, two-phase logic array according to claim 15, wherein said at least one codeword state detection line and said at least one function output line for said at least one output signal is connected to inputs of first and second AND gates respectively corresponding to said pair of output lines and wherein one of said first and second AND gates receives an inverted output of said at least one function output line.

20. The programmable two-line, two-phase logic array according to claim 15, wherein said codeword state detection circuit is formed with CMOS.

\* \* \* \* \*